(12) United States Patent
Tamura et al.

(10) Patent No.: US 11,192,367 B2
(45) Date of Patent: Dec. 7, 2021

(54) PIEZOELECTRIC DEVICE, LIQUID DISCHARGING HEAD, AND LIQUID DISCHARGING APPARATUS

(71) Applicant: SEIKO EPSON CORPORATION, Tokyo (JP)

(72) Inventors: Hiroaki Tamura, Suwa-gun (JP); Sayaka Yamasaki, Shino (JP)

(73) Assignee: Seiko Epson Corporation, Tokyo (JP)

( * ) Notice: Subject to any disclaimer, the term of this patent is extended or adjusted under 35 U.S.C. 154(b) by 809 days.

(21) Appl. No.: 15/987,255

(22) Filed: May 23, 2018

(65) Prior Publication Data
US 2018/0339514 A1 Nov. 29, 2018

(30) Foreign Application Priority Data

May 29, 2017 (JP) .............................. JP2017-105594

(51) Int. Cl.
*B41J 2/14* (2006.01)
*H01L 41/09* (2006.01)
*H01L 41/08* (2006.01)

(52) U.S. Cl.
CPC ........ *B41J 2/14233* (2013.01); *H01L 41/081* (2013.01); *H01L 41/0973* (2013.01)

(58) Field of Classification Search
None
See application file for complete search history.

(56) References Cited

U.S. PATENT DOCUMENTS

| 2,472,691 A | * | 6/1949 | Bond ................. H03H 9/02157 |
| | | | 310/360 |
| 2011/0002485 A1 | * | 1/2011 | Onishi .................. B06B 1/0603 |
| | | | 381/190 |
| 2016/0263892 A1 | * | 9/2016 | Mizukami ............ B41J 2/14233 |

FOREIGN PATENT DOCUMENTS

JP 2002-67307 A 3/2002

* cited by examiner

*Primary Examiner* — Erica S Lin
(74) *Attorney, Agent, or Firm* — Workman Nydegger

(57) ABSTRACT

There is provided a piezoelectric device including a pressure chamber, a piezoelectric element, and a diaphragm disposed between the pressure chamber and the piezoelectric element. The diaphragm has a vibration region that overlaps the pressure chamber in plan view. The piezoelectric element overlaps the vibration region in plan view. The diaphragm has a crystal plane {110} of a single crystal silicon base, or a crystal plane of a single crystal silicon base of which a Young's modulus and a Poisson's ratio vary according to a crystal orientation.

9 Claims, 8 Drawing Sheets

PIEZOELECTRIC DEVICE, LIQUID DISCHARGING HEAD, AND LIQUID DISCHARGING APPARATUS

The entire disclosure of Japanese Patent Application No. 2017-105594, filed May 29, 2017 is expressly incorporated by reference herein.

BACKGROUND

1. Technical Field

The present invention relates to a technique in which a piezoelectric device causes a pressure change.

2. Related Art

A liquid discharging head that discharges, from nozzles, a liquid such as an ink supplied to a pressure chamber by a piezoelectric device causing a pressure change in the pressure chamber is proposed in the related art. For example, a technique, in which a piezoelectric device including a diaphragm configuring a wall surface (top surface) of a pressure chamber and a piezoelectric element vibrating the diaphragm is provided for each pressure chamber, is disclosed in JP-A-2002-67307. An active layer substrate (portion that deforms due to vibration) of the diaphragm is configured of a silicon base of which a Young's modulus changes according to a direction in a crystal plane. In JP-A-2002-67307, the diaphragm is made likely to deform in a lateral direction by aligning the lateral direction of the diaphragm with a direction, in which a Young's modulus of the diaphragm in the lateral direction is lower than a Young's modulus of the diaphragm in a longitudinal direction, in a crystal plane. Thus, the displacement properties of the diaphragm are enhanced.

However, in a case where the diaphragm is configured of a single crystal silicon base of which a Young's modulus changes according to a direction in a crystal plane as in JP-A-2002-67307, unevenness of local stress distribution is likely to occur in a peripheral direction of the diaphragm. That is because a Young's modulus in the crystal plane continuously changes not only in two specific orientations such as the lateral direction and the longitudinal direction but also in the peripheral direction. For this reason, as in JP-A-2002-67307, there is a possibility that the displacement of the diaphragm is inhibited as a whole or a crack is likely to occur due to unevenness of local stress distribution if a direction of the diaphragm is simply aligned according to a Young's modulus in the lateral direction and the longitudinal direction.

SUMMARY

An advantage of some aspects of the invention is to improve displacement properties while suppressing the generation of a crack.

According to an aspect of the invention, there is provided a piezoelectric device including a pressure chamber, a piezoelectric element, and a diaphragm disposed between the pressure chamber and the piezoelectric element. The diaphragm has a crystal plane {110} of a single crystal silicon base. The diaphragm has a vibration region that overlaps the pressure chamber in plan view. The piezoelectric element overlaps the vibration region in plan view. When the vibration region is divided into a first region from a crystal orientation <-111> to a crystal orientation <1-12>, a second region from the crystal orientation <1-12> to a crystal orientation <1-1-1>, a third region from the crystal orientation <1-1-1> to a crystal orientation <-11-2>, and a fourth region from the crystal orientation <-11-2> to the crystal orientation <-111> in the crystal plane in a peripheral direction, the vibration region is on an inside of an imaginary perfect circle in the second region and the fourth region, and at least some parts of the vibration region are on an outside of the imaginary perfect circle in the first region and the third region if a shape of the vibration region is compared with the imaginary perfect circle which has a diameter in a direction of the crystal orientation <-111> and a diameter in a direction of the crystal orientation <1-12> in common with the vibration region. According to this configuration, the shape of the vibration region of the diaphragm is a shape according to a change in the Young's modulus and the Poisson's ratio in the peripheral direction in a case where the diaphragm has the crystal plane {110} of the single crystal silicon base. For this reason, a strain that occurs in the vibration region of the diaphragm can be uniformized in the peripheral direction. Since the entire diaphragm is likely to be displaced and the occurrence of locally uneven stress concentration can be suppressed, the displacement properties of the diaphragm can be improved while the generation of a crack is suppressed.

In the piezoelectric device, the vibration region may be on the outside of the imaginary perfect circle in a region of the first region, which ranges from the crystal orientation <-111> to an orientation of 59 degrees toward the crystal orientation <1-12>, and the vibration region may be on the outside of the imaginary perfect circle in a region of the third region, which ranges from the crystal orientation <1-1-1> to an orientation of 59 degrees toward the crystal orientation <-11-2>. According to this configuration, since the first region and the third region of the crystal plane {110} each have a region where a change in the Young's modulus is great and a region where a change in the Young's modulus is small while a change in the Poisson's ratio is not so great, the diameter of the vibration region can be made larger than the diameter of the imaginary perfect circle in the region where a change in the Young's modulus is great. Since a deflection amount of the diaphragm is likely to be suppressed in the region where a change in the Young's modulus is great, the diaphragm can be made likely to deflect by making the diameter of the vibration region larger than the diameter of the perfect circle.

In the piezoelectric device, the shape of the vibration region may be point-symmetric with respect to a center of the vibration region in the first region and the third region, and may be point-symmetric with respect to the center of the vibration region in the second region and the fourth region. According to this configuration, a shape in accordance with the symmetry of the Young's modulus and the Poisson's ratio in the crystal plane {110} can be adopted as the shape of the vibration region. Accordingly, an effect of uniformizing a strain that occurs in the vibration region of the diaphragm in the peripheral direction can be enhanced.

According to another aspect of the invention, there is provided a piezoelectric device including a pressure chamber, a piezoelectric element, a diaphragm disposed between the pressure chamber and the piezoelectric element. The diaphragm has a crystal plane of a single crystal silicon base of which a Young's modulus and a Poisson's ratio vary according to a crystal orientation. The diaphragm has a vibration region that overlaps the pressure chamber in plan view. The piezoelectric element overlaps the vibration region in plan view. When a diameter of the vibration region in a predetermined orientation is set as d1, the Young's modulus in the predetermined orientation is set as Y1, the Poisson's ratio in the predetermined orientation is set as v1, the Young's modulus of the vibration region in any orientation is set as Y, and the Poisson's ratio in any orientation is set as v, the diameter d of the vibration region in any orientation satisfies a relationship of $d=\sqrt{\{(d1)^2 \times (1-v1) \times Y/Y1 \times (1-v)\}}$. According to this configuration, the shape of the vibration region of the diaphragm can be made as a shape according to a change in the Young's modulus and the Poisson's ratio in the peripheral direction. Accordingly, a strain that occurs in any direction, which is the peripheral direction of the vibration region, can be uniformized. Therefore, since the entire diaphragm is likely to be displaced and the occurrence of locally uneven stress concentration can be suppressed, the displacement properties of the diaphragm can be improved while the generation of a crack is suppressed.

According to still another aspect of the invention, there is provided a liquid discharging head including the piezoelectric device according to any one of the aspects described above. A liquid that has filled the pressure chamber is discharged from a nozzle by the piezoelectric element vibrating the diaphragm to change a pressure of the pressure chamber. According to this configuration, the liquid discharging head including the piezoelectric device that can improve displacement properties while suppressing the generation of a crack can be provided.

According to still another aspect of the invention, there is provided a liquid discharging apparatus including the piezoelectric device according to any one of the aspects described above. A liquid that has filled the pressure chamber is discharged from a nozzle by the piezoelectric element vibrating the diaphragm to change a pressure of the pressure chamber. According to this configuration, the liquid discharging apparatus including the piezoelectric device that can improve displacement properties while suppressing the generation of a crack can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
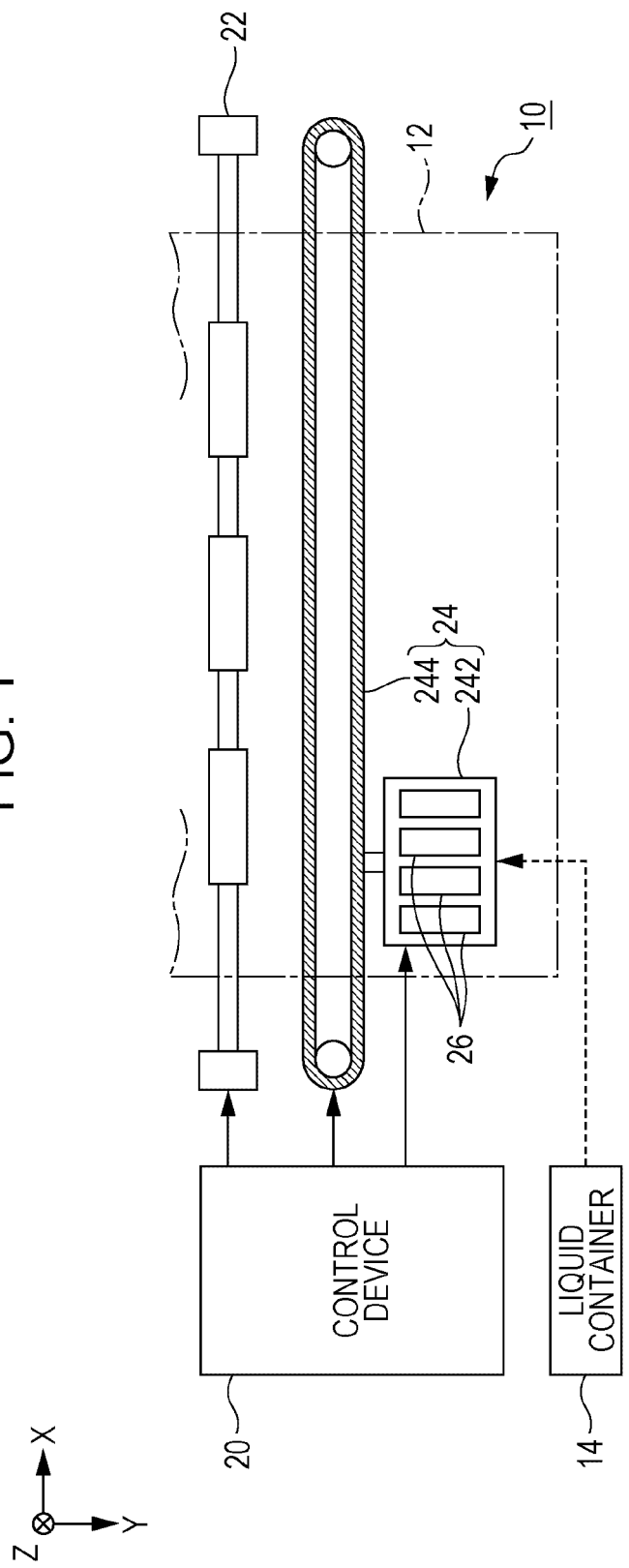
FIG. 1 is a view illustrating a configuration of a liquid discharging apparatus according to a first embodiment of the invention.

FIG. 1 is a view illustrating a configuration of a liquid discharging apparatus 10 according to a first embodiment of the invention. The liquid discharging apparatus 10 of the first embodiment is an ink jet printing apparatus that discharges an ink, which is an example of a liquid, onto a medium 12. Although the medium 12 is typical printing paper, any printing target such as a resin film and cloth can be used as the medium 12. As illustrated in FIG. 1, a liquid container 14 storing an ink is fixed to the liquid discharging apparatus 10. For example, a cartridge that is attachable/detachable to/from the liquid discharging apparatus 10, a bag-like ink pack formed of a flexible film, or an ink tank that can be refilled with an ink is used as the liquid container 14. A plurality of types of inks having different colors are stored in the liquid container 14.

As illustrated in FIG. 1, the liquid discharging apparatus 10 includes a control device 20, a transporting mechanism 22, a moving mechanism 24, and a plurality of liquid discharging heads 26. The control device 20 includes, for example, a processing circuit, such as a central processing unit (CPU) and a field programmable gate array (FPGA), and a memory circuit, such as a semiconductor memory, and comprehensively controls each element of the liquid discharging apparatus 10. The transporting mechanism 22 transports the medium 12 in a Y-direction under the control of the control device 20.

The moving mechanism 24 causes the plurality of liquid discharging heads 26 to reciprocate in an X-direction under the control of the control device 20. The X-direction is a direction intersecting (typically orthogonal to) the Y-direction in which the medium 12 is transported. The moving mechanism 24 includes a carriage 242 on which the plurality of liquid discharging heads 26 are mounted and an endless belt 244 to which the carriage 242 is fixed. It is also possible to mount the liquid container 14 on the carriage 242 with the liquid discharging heads 26.

Each of the plurality of liquid discharging heads 26 discharges an ink, which is supplied from the liquid container 14, onto the medium 12 from a plurality of nozzles (discharge holes) N under the control of the control device 20. A desired image is formed on an outer surface of the medium 12 by each of the liquid discharging heads 26 discharging an ink onto the medium 12 as the transportation of the medium 12 by the transporting mechanism 22 and the repeated reciprocation of the carriage 242 are performed at the same time. Hereinafter, a direction perpendicular to an XY-plane (for example, a plane parallel to the outer surface of the medium 12) will be referred to as a Z-direction. A direction (typical vertical direction), in which an ink is discharged by each of the liquid discharging heads 26, corresponds to the Z-direction.

Liquid Discharging Head

Figure 2:
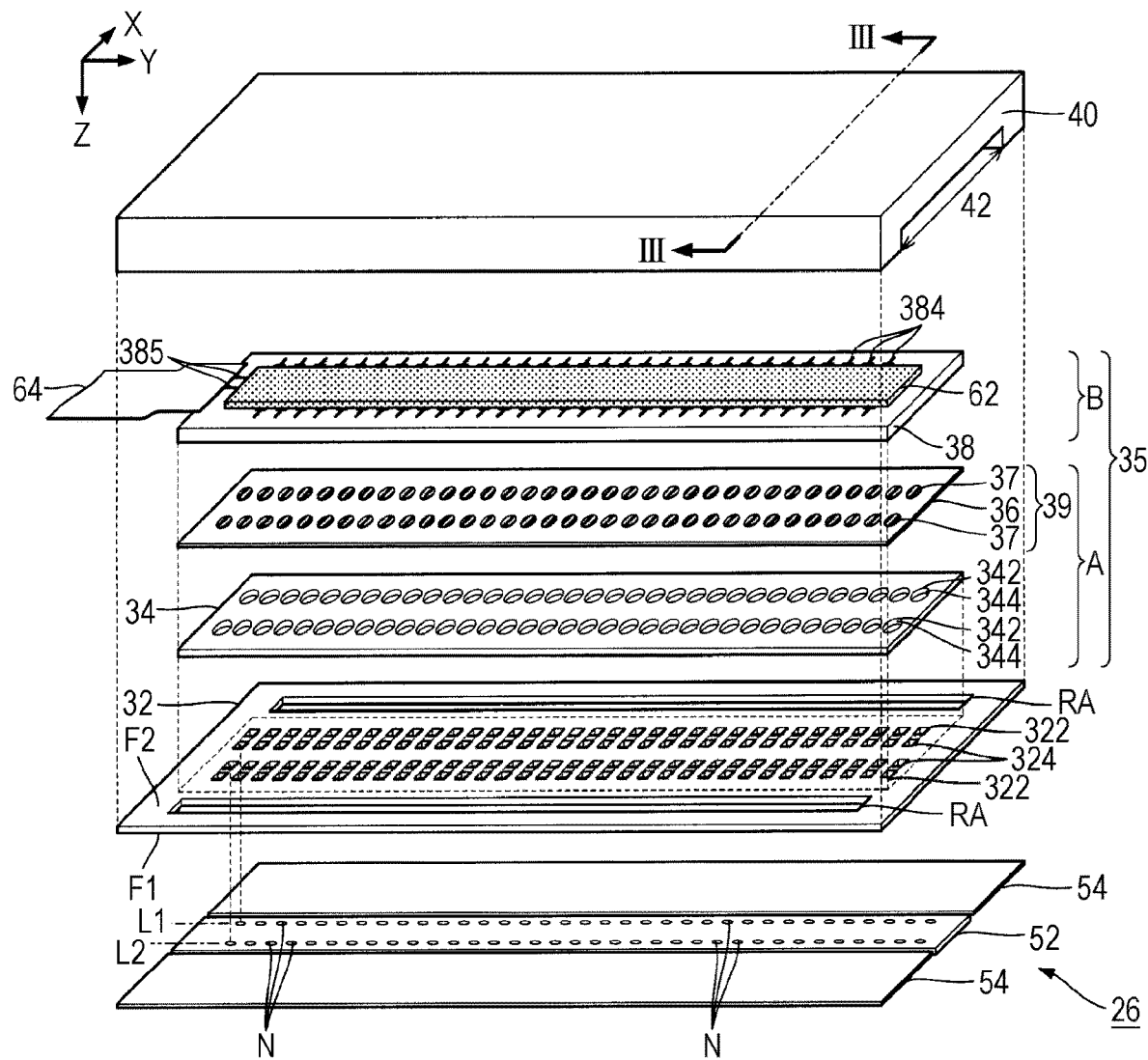
FIG. 2 is an exploded perspective view of a liquid discharging head.
Figure 3:
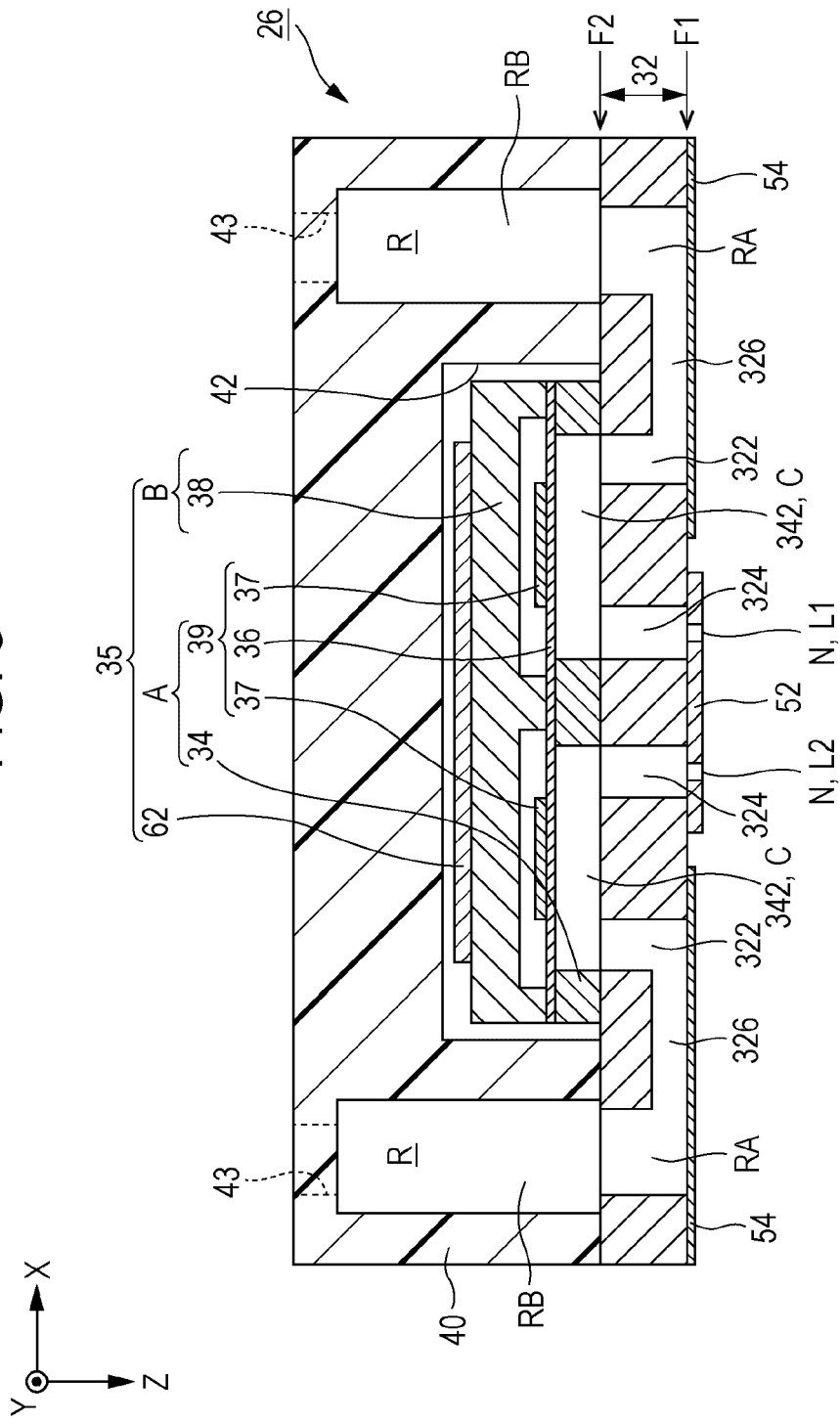
FIG. 3 is a sectional view of the liquid discharging head illustrated in FIG. 2 taken along line III-III.

FIG. 2 is an exploded perspective view of any one of the liquid discharging heads 26, and FIG. 3 is a sectional view taken along line III-III of FIG. 2. As illustrated in FIG. 2, the liquid discharging head 26 includes the plurality of nozzles N arranged in the Y-direction. The plurality of nozzles N of the first embodiment are classified into a first line L1 and a second line L2. Although it is also possible to make the positions of the nozzles N in the Y-direction different from each other between the first line L1 and the second line L2 (that is, zigzag disposition or staggered disposition), a configuration where the positions of the nozzles N in the Y-direction match the first line L1 and the second line L2 is given as an example in FIG. 3 for convenience. As illustrated in FIG. 2, the liquid discharging head 26 has a structure in which elements related to the plurality of nozzles N in the first line L1 and elements related to the plurality of nozzles N in the second line L2 are disposed so as to be substantially linearly symmetric to each other.

As illustrated in FIGS. 2 and 3, the liquid discharging head 26 includes a flow path substrate 32. The flow path substrate 32 is a plate-like member including an outer surface F1 and an outer surface F2. The outer surface F1 is an outer surface (outer surface on a medium 12 side) on a positive side of the Z-direction, and the outer surface F2 is an outer surface on a side (negative side of the Z-direction) opposite to the outer surface F1. A pressure generating unit 35 and a case member 40 are provided on the outer surface F2 of the flow path substrate 32, and a nozzle plate 52 and compliance substrates 54 are provided on the outer surface F1. Each element of the liquid discharging head 26 is a substantially plate-like member which is long in the Y-direction just as the flow path substrate 32. The elements are bonded to each other using, for example, an adhesive. It is also possible to perceive a direction, in which the flow path substrate 32 and a pressure chamber substrate 34 are stacked, as the Z-direction.

The pressure generating unit 35 is an element that causes a pressure change for discharging inks from the nozzles N. The pressure generating unit 35 of the embodiment is configured by a first substrate A including the pressure chamber substrate 34 and the piezoelectric device 39, a second substrate B including a wiring connection substrate (protection substrate) 38, and a drive IC 62 being bonded to each other. The piezoelectric device 39 is formed of pressure chambers C (to be described later) formed in the pressure chamber substrate 34, piezoelectric elements 37, and a diaphragm 36 disposed between the pressure chambers C and the piezoelectric elements 37, and is an element that causes a pressure change in the pressure chambers C by vibration. Details of the pressure generating unit 35 and the piezoelectric device 39 will be described later.

The nozzle plate 52 is a plate-like member in which the plurality of nozzles N are formed, and is provided on the outer surface F1 of the flow path substrate 32 using, for example, an adhesive. Each of the nozzles N is a through-hole through which an ink passes. The nozzle plate 52 of the first embodiment is manufactured by processing a single crystal silicon (Si) base (silicon substrate) using a semiconductor manufacturing technique. However, any known material or any known manufacturing method can be adopted in manufacturing the nozzle plate 52.

The flow path substrate 32 is a plate-like member for forming a flow path of an ink. As illustrated in FIGS. 2 and 3, a space RA, a plurality of supply flow paths 322, and a plurality of communication flow paths 324 are formed for each of the first line L1 and the second line L2 in the flow path substrate 32. The spaces RA are long openings which run in the Y-direction in plan view (that is, seen from the Z-direction), and the supply flow path 322 and the communication flow path 324 are through-holes formed for each of the nozzles N. The plurality of supply flow paths 322 are arranged in the Y-direction, and the plurality of communication flow paths 324 are also arranged in the Y-direction. As illustrated in FIG. 3, intermediate flow paths 326 which reach the plurality of supply flow paths 322 are formed in the outer surface F1 of the flow path substrate 32. Each of the intermediate flow paths 326 is a flow path connecting the space RA and the plurality of supply flow paths 322 together. The communication flow paths 324 communicate with the nozzles N.

The wiring connection substrate 38 of FIGS. 2 and 3 is a plate-like member for protecting the plurality of piezoelectric elements 37, and is provided on an outer surface (outer surface on a side opposite to the pressure chambers C) of the diaphragm 36. Although any material or any manufacturing method can be used for the wiring connection substrate 38, the wiring connection substrate 38 can be formed by processing a single crystal silicon (Si) base (silicon substrate) using a semiconductor manufacturing technique as in the case of the flow path substrate 32 and the pressure chamber substrate 34. As illustrated in FIGS. 2 and 3, the drive IC 62 is provided on an outer surface of the wiring connection substrate 38 (hereinafter, referred to as a "mount surface") on a side opposite to the outer surface (hereinafter, referred to as a "bonded surface") on a diaphragm 36 side. The drive IC 62 is a substantially rectangular IC chip on which a drive circuit that drives each of the piezoelectric elements 37 by generating and supplying a drive signal under the control of the control device 20 is mounted. On the mount surface of the wiring connection substrate 38, wiring 384 connected to an output terminal for a drive signal (drive voltage) of the drive IC 62 is formed for each of the piezoelectric elements 37. In addition, each of wiring pieces 385 connected to an output terminal for a base voltage (base voltage of a drive signal of each of the piezoelectric elements 37) of the drive IC 62 is consecutively formed on the mount surface of the wiring connection substrate 38 along the disposition of the piezoelectric elements 37 in the Y-direction.

The case member 40 illustrated in FIGS. 2 and 3 is a case for storing an ink to be supplied to the plurality of pressure chambers C (furthermore, the plurality of nozzles N). An outer surface of the case member 40 on the positive side of the Z-direction is fixed to the outer surface F2 of the flow path substrate 32 with, for example, an adhesive. As illustrated in FIGS. 2 and 3, a grooved recessed portion 42 extending in the Y-direction is formed in the outer surface of the case member 40 on the positive side of the Z-direction. The wiring connection substrate 38 and the drive IC 62 are accommodated inside the recessed portion 42. The case member 40 is formed of a material different from materials of the flow path substrate 32 and the pressure chamber substrate 34. It is possible to manufacture the case member 40 with, for example, a resin material by injection molding. However, any known material or any known manufacturing method can be adopted in manufacturing the case member 40. For example, a synthetic fiber or a resin material is suitable as a material of the case member 40.

As illustrated in FIG. 3, a space RB is formed for each of the first line L1 and the second line L2 in the case member 40. The spaces RB of the case member 40 and the spaces RA of the flow path substrate 32 communicate with each other. A space configured of the space RA and the space RB functions as a liquid storing chamber (reservoir) R storing an ink to be supplied to the plurality of pressure chambers C. The liquid storing chamber R is a common liquid chamber that reaches the plurality of nozzles N. An inlet 43 for causing an ink to be supplied from the liquid container 14 to flow into the liquid storing chamber R is formed for each of the first line L1 and the second line L2 in the outer surface of the case member 40 on a side opposite to the flow path substrate 32.

An ink supplied from the liquid container 14 to the inlet 43 is stored in the space RB and the space RA of the liquid storing chamber R. The ink stored in the liquid storing chamber R is divided into the plurality of supply flow paths 322 from the intermediate flow paths 326 so as to be supplied to and so as to fill each of the pressure chambers C in parallel.

As illustrated in FIG. 2, the compliance substrates 54 are provided on the outer surface F1. The compliance substrates 54 are flexible films that absorb a pressure change of an ink in the liquid storing chambers R. As illustrated in FIG. 3, the compliance substrates 54 are provided on the outer surface F1 of the flow path substrate 32 so as to close the spaces RA of the flow path substrate 32, the intermediate flow paths 326, and the plurality of supply flow paths 322, and configure wall surfaces (specifically, bottom surfaces) of the liquid storing chamber R.

The pressure generating unit 35 illustrated in FIG. 3 is configured by stacking the first substrate A, the second substrate B, and the drive IC 62. The first substrate A is a substrate that includes the pressure chamber substrate 34, the diaphragm 36, and the plurality of piezoelectric elements 37, and the second substrate B is a substrate that includes the wiring connection substrate 38.

The pressure chamber substrate 34 is a plate-like member, in which a plurality of openings 342 configuring the pressure chambers C are formed for each of the first line L1 and the second line L2, and is provided on the outer surface F2 of the flow path substrate 32 using, for example, an adhesive. The plurality of openings 342 are arranged in the Y-direction. Each of the openings 342 is a through-hole, which is formed for each of the nozzles N and runs in the X-direction in plan view. The flow path substrate 32 and the pressure chamber substrate 34 are manufactured by processing single crystal silicon (Si) substrates (silicon substrates) using a semiconductor manufacturing technique as in the case of the nozzle plate 52 described above. However, any known material and any known method can be adopted in manufacturing the flow path substrate 32 and the pressure chamber substrate 34. The piezoelectric device 39 is provided on an outer surface of the pressure chamber substrate 34 on a side opposite to the flow path substrate 32.

Piezoelectric Device

Figure 4:
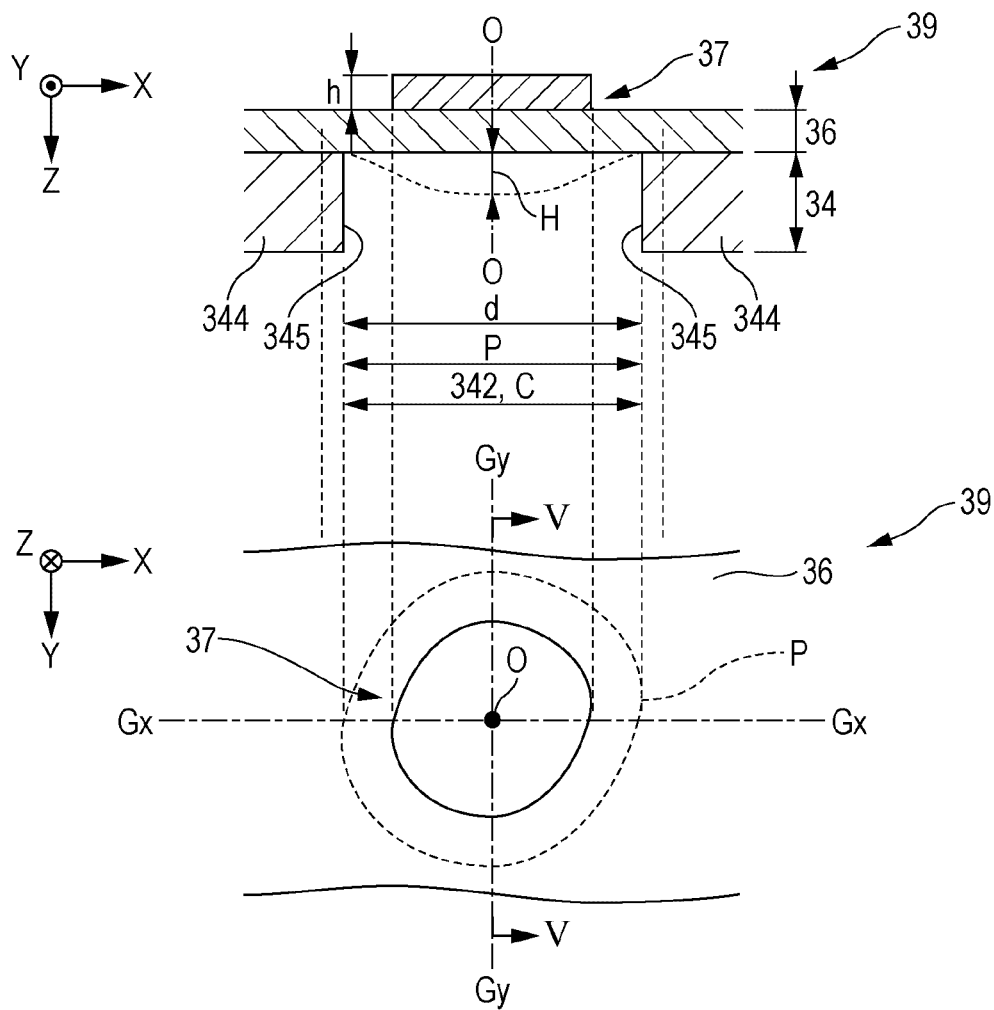
FIG. 4 is a sectional view and a plan view of a piezoelectric device.
Figure 5:
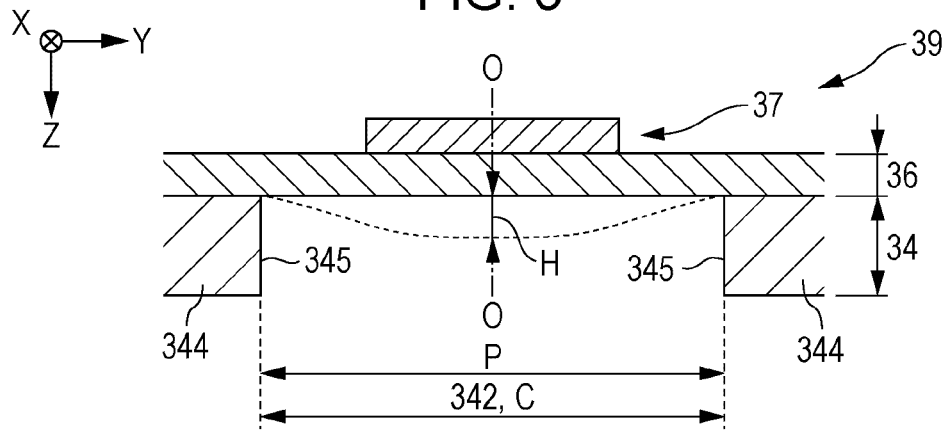
FIG. 5 is a sectional view of the piezoelectric device illustrated in FIG. 4 taken along line V-V.

FIG. 4 is a sectional view and a plan view of the enlarged piezoelectric device 39. The sectional view (view on the upper side of FIG. 4) of FIG. 4 is a view obtained by cutting the piezoelectric device 39 with an XZ-plane, and the plan view (view on the lower side of FIG. 4) of FIG. 4 is a view in which the piezoelectric device 39 is seen from the Z-direction. FIG. 5 is a sectional view of the piezoelectric device 39 illustrated in FIG. 4 taken along line V-V.

As illustrated in FIGS. 4 and 5, the piezoelectric device 39 is formed of the pressure chambers C, the piezoelectric elements 37, and the diaphragm 36, and causes a pressure change in each of the pressure chambers C by the piezoelectric elements 37 vibrating the diaphragm 36. The shape of the inner periphery 345 of the pressure chamber C of FIG. 4 is a substantially circle in plan view. The shape of the inner periphery 345 of the pressure chamber C is the shape of the inner periphery 345 of the pressure chamber C in plan view seen from the Z-direction, and defines a vibration region P of the diaphragm 36. The vibration region P of the diaphragm 36 is a region of the diaphragm 36, which overlaps the pressure chamber C in plan view, and is a region that configures a wall surface (top surface) of the pressure chamber C. The piezoelectric elements 37 are disposed so as to overlap the pressure chambers C in plan view. Specifically, the piezoelectric elements 37 are disposed on the diaphragm 36 so as to overlap centers (centers of the vibration regions P) O of the pressure chambers C in plan view.

As illustrated in FIGS. 2 and 3, the outer surface F2 of the flow path substrate 32 and the diaphragm 36 face each other at an interval inside each of the openings 342. A space positioned inside each of the openings 342 between the outer surface F2 of the flow path substrate 32 and the diaphragm 36 functions as each of the pressure chambers C for applying a pressure to an ink which has filled the space. The pressure chamber C is separately formed for each of the nozzles N. As illustrated in FIG. 2, the plurality of pressure chambers C (openings 342) are arranged in the Y-direction for each of the first line L1 and the second line L2. Any one of the pressure chambers C communicates with the space RA via the supply flow path 322 and the intermediate flow path 326, and communicates with the nozzle N via the communication flow path 324.

As illustrated in FIGS. 2 and 3, the plurality of piezoelectric elements 37 corresponding to different nozzles N are provided for each of the first line L1 and the second line L2 on an outer surface of the diaphragm 36 on a side opposite to the pressure chambers C. The piezoelectric elements 37 are pressure generating elements that deform due to supply of a drive signal and generate pressures in the pressure chambers C. Each of the plurality of piezoelectric elements 37 is arranged in the Y-direction so as to correspond to each of the pressure chambers C.

Each of the piezoelectric elements 37 is a stacked body of which a piezoelectric layer is sandwiched between a first electrode and a second electrode, which face each other. By applying a voltage to an area between the first electrode and the second electrode, a piezoelectric strain occurs in the piezoelectric layer sandwiched between the first electrode and the second electrode and thus the piezoelectric layer is displaced. Therefore, each of the piezoelectric elements 37 is a portion in which the first electrode, the second electrode, and the piezoelectric layer overlap each other. A pressure in each of the pressure chambers C changes by the diaphragm 36 vibrating in tandem with a piezoelectric strain of the piezoelectric layer 373. An adhesive layer for ensuring adhesion may be provided between the piezoelectric elements 37 and the diaphragm 36. That is, it is not necessary for the piezoelectric elements 37 to be directly provided on the outer surface of the diaphragm 36, and the piezoelectric elements may be provided on the outer surface of the diaphragm 36 via the adhesive layer. Zirconium, a zirconium oxide, titanium, a titanium oxide, and a silicon oxide can be used for the adhesive layer.

As illustrated in FIGS. 4 and 5, the diaphragm 36 is a plate-like member that can elastically vibrate. The diaphragm 36 of the embodiment is configured of an anisotropic single crystal silicon base of which a Young's modulus and a Poisson's ratio vary according to a direction in a crystal plane, and the outer surface of the diaphragm 36 is configured of a crystal plane of the single crystal silicon base. However, a crystal of the single crystal silicon base is not limited to being as the outer surface of the diaphragm 36, and may be included at least in the diaphragm 36. For example, in a case where the diaphragm 36 is formed by stacking a plurality of materials, the crystal of the single crystal silicon base may be included in the stacked materials. The diaphragm 36 is stacked and bonded to the side walls 344 (pressure chamber substrate 34) of the pressure chambers C and configures a wall surface (specifically, a top surface) intersecting the side walls 344 of the pressure chambers C. As described above, the vibration regions P of the diaphragm 36 are regions (regions configuring the top surfaces of the pressure chambers C) of the diaphragm 36, which overlap the pressure chambers C in plan view, and are deflected by the piezoelectric elements 37 to be displaced in the Z-direction. Each of the vibration regions P of the embodiment is a substantially circle which is the same as the pressure chamber C in plan view, and has an axis Gx that passes through the center O along the X-direction and an axis Gy that passes through the center O along the Y-direction.

In the piezoelectric device 39 having such a configuration, displacement H in the Z-direction occurs in the vibration regions P of the diaphragm 36 due to piezoelectric strains of the piezoelectric elements 37 as illustrated with dotted lines of FIGS. 4 and 5. In this case, for example, a Young's modulus and a Poisson's ratio of a crystal plane of a silicon base changes according to a direction in a crystal plane.

Figure 6:
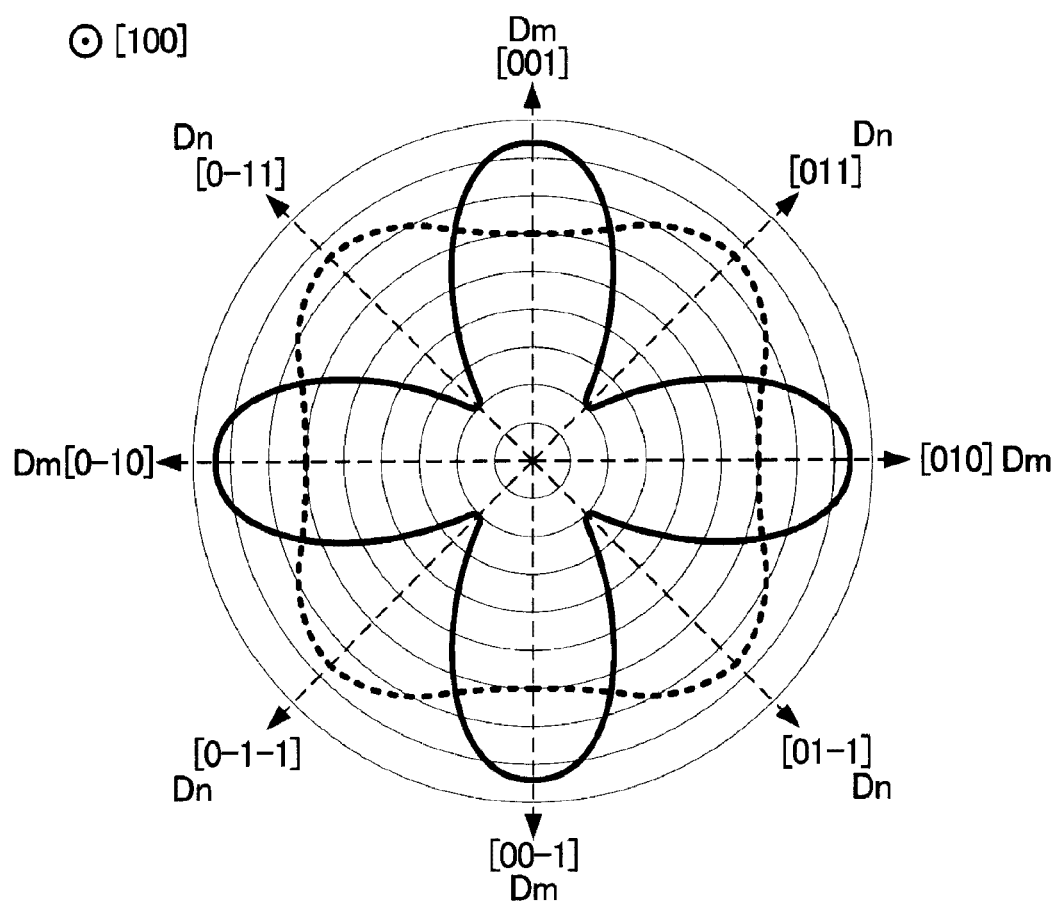
FIG. 6 is a graph showing an example of anisotropy of a Young's modulus of a single crystal silicon base in a (100) plane.

FIG. 6 is a graph showing an example of anisotropy of a Poisson's ratio and a Young's modulus in a (100) plane of a single crystal silicon base of which the crystal plane is the (100) plane (crystal orientation perpendicular to the crystal plane is [100]). In FIG. 6, a graph of anisotropy of the Poisson's ratio is shown with a solid line, and a graph of anisotropy of the Young's modulus is shown with a dotted line. FIG. 6 is expressed in polar coordinates, and the Young's modulus or the Poisson's ratio becomes higher as a distance from the center becomes longer.

As shown in FIG. 6, while the Young's modulus in the (100) plane of the single crystal silicon base, of which the crystal plane is the (100) plane, has substantially square anisotropy, the Poisson's ratio has quatrefoiled anisotropy. As described above, in the (100) plane of the single crystal silicon base, the Young's modulus and Poisson's ratio continuously change in a peripheral direction and the anisotropy of the Young's modulus and the anisotropy of the Poisson's ratio are different from each other. In FIG. 6, a Young's modulus is a minimum value in four crystal orientations [010], [001], [0-10], and [00-1]. When the orientations are set as Dm, a Young's modulus is a maximum value at orientations Dn of, for example, 45 degrees counterclockwise from the orientations Dm. On the other hand, as for the Poisson's ratio shown in FIG. 6, a change in the Poisson's ratio becomes greater near the crystal orientation [001] in which a Young's modulus is low.

Figure 7:
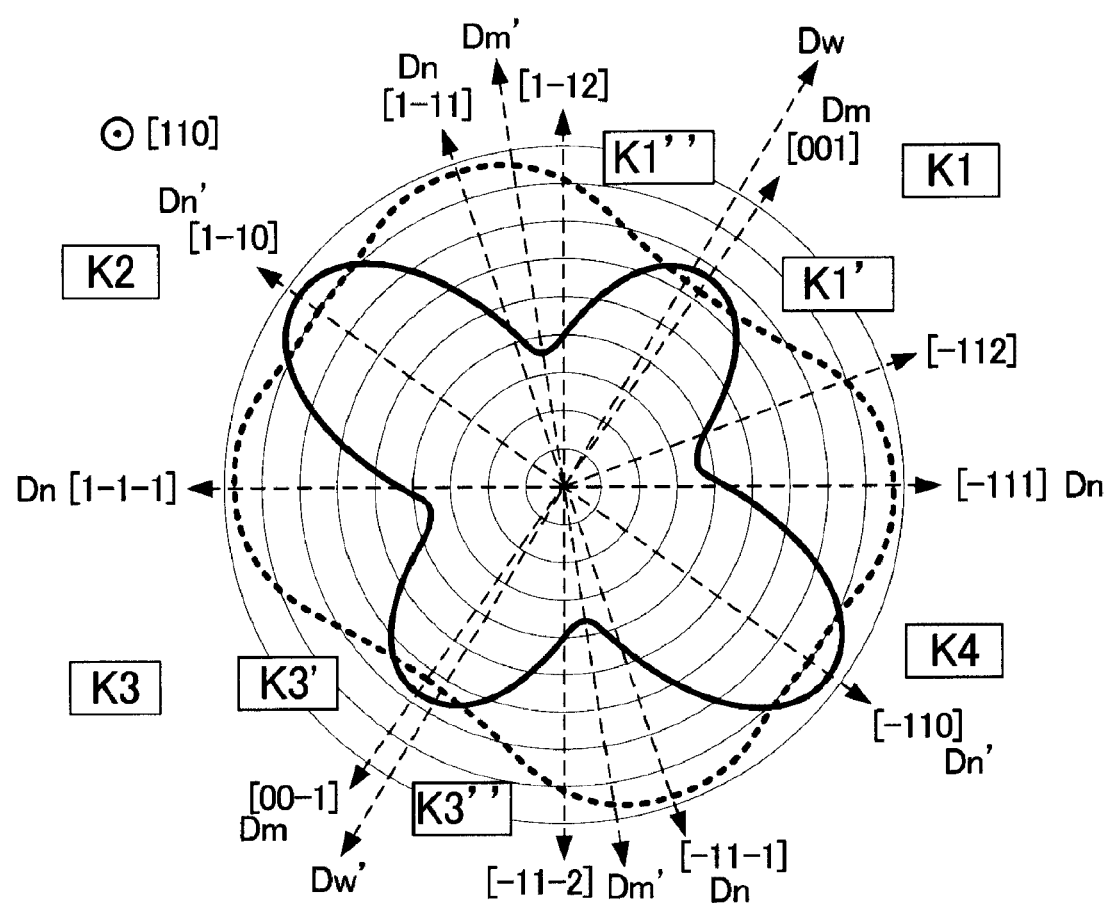
FIG. 7 is a graph showing an example of the anisotropy of the Young's modulus of the single crystal silicon base in a (110) plane.

FIG. 7 is a graph showing an example of anisotropy of a Poisson's ratio and a Young's modulus in the (110) plane of the single crystal silicon base of which the crystal plane is the (110) plane. In FIG. 7, a graph of anisotropy of the Poisson's ratio is shown with a solid line, and a graph of anisotropy of the Young's modulus is shown with a dotted line. FIG. 7 is expressed in polar coordinates, and the Young's modulus or the Poisson's ratio becomes higher as a distance from the center becomes longer.

As shown in FIG. 7, while the Young's modulus in the (110) plane of the single crystal silicon base has substantially rectangular anisotropy, the Poisson's ratio has quatrefoiled anisotropy. As described above, also in the (110) plane of the single crystal silicon base, the Young's modulus and Poisson's ratio continuously change in the peripheral direction and the anisotropy of the Young's modulus and the anisotropy of the Poisson's ratio are different from each other. In FIG. 7, in the (110) plane, for example, a Young's modulus is minimum in the crystal orientation [001], and for example, a Young's modulus is a maximum value in a crystal orientation [1-11] of 45 degrees counterclockwise from the crystal orientation [001]. On the other hand, a change in the Poisson's ratio becomes greater near the crystal orientation [001] in which a Young's modulus is low.

As described above, in the single crystal silicon base of which the Young's modulus and the Poisson's ratio change according to a crystal orientation, the Young's modulus and the Poisson's ratio continuously change in the peripheral direction. Therefore, in a case where the diaphragm 36 is configured of such a single crystal silicon base, unevenness of local stress distribution is likely to occur in a peripheral direction of the diaphragm 36. That is because the Young's modulus in the crystal plane continuously changes not only in two specific orientations such as a lateral direction and a longitudinal direction but also in the peripheral direction. For this reason, there is a possibility that the displacement of the diaphragm 36 is inhibited as a whole or a crack is likely to occur due to unevenness of local stress distribution if a direction of the diaphragm 36 is simply aligned according to a Young's modulus in the lateral direction and the longitudinal direction. When a crack is generated, the piezoelectric elements 37 or the pressure chambers C are likely to be destroyed in some cases. It is necessary to consider the shape of the vibration region P of the diaphragm 36 (shape of the inner periphery 345 of the pressure chamber C) while considering not only a change in the Young's modulus but also a change in the Poisson's ratio in the peripheral direction of the diaphragm 36 since the anisotropy of the Young's modulus and the anisotropy of the Poisson's ratio are different from each other.

In the first embodiment, the shape of the vibration region P of the diaphragm 36 is made as a shape according to a change in the Young's modulus and the Poisson's ratio in the peripheral direction. Accordingly, a strain that occurs in the vibration region P of the diaphragm 36 can be uniformized in the peripheral direction. Therefore, since the entire diaphragm 36 is likely to be displaced and the occurrence of locally uneven stress concentration can be suppressed, the displacement properties of the diaphragm 36 can be improved while the generation of a crack is suppressed.

Hereinafter, the shape of the vibration region P of the diaphragm 36 will be described based on a relationship between the orientations of the Young's modulus and the Poisson's ratio and the displacement of the vibration region P. When a piezoelectric stress constant of the piezoelectric layer 373 in the Z-direction is set as $e_f$ (N/V/m) and an applied electric field is set as E (V/m), a stress F (N) occurred in the piezoelectric element 37 can be expressed as the following Equation (1).

$$F = e_f \times E \tag{1}$$

When the thickness of the diaphragm 36 is set as h (m), the diameter of the vibration region P is set as d (m), the Young's modulus in a direction of the diameter is set as Y, and the Poisson's ratio in the direction of the diameter is set as v as illustrated in the sectional view of FIG. 4, the displacement (deflection) H (m) of the center (center of the pressure chamber C) O of the vibration region P can be expressed as the following Equation (2).

$$H = 3 \times F \times d^2 \times (1-v)/(h^2 \times Y) \tag{2}$$

Herein, the diameter of the vibration region P in a predetermined orientation is set as d1 and the diameter of the vibration region P in any orientation is set as d. A Young's modulus of the silicon base in a predetermined orientation is set as Y1 and a Poisson's ratio of the silicon base in the predetermined orientation is set as v1. A Young's modulus of the silicon base in any orientation is set as Y and a Poisson's ratio of the silicon base in any orientation is set as v. When a relationship of the following Equation (3) is satisfied, a strain that occurs in the vibration region P can be uniformized in the peripheral direction. The relationship of the following Equation (3) is a relationship in which the displacement (deflection) H1 at a central position of the diameter d1 of the vibration region P in the predetermined orientation is equal to the displacement (deflection) H at a central position of the diameter d of the vibration region P in any orientation. When the following Equation (3) is rearranged, the following Equation (4) can be derived. For example, a crystal orientation of [-111] can be selected as the predetermined orientation. Without being limited thereto, however, other crystal orientations may be selected.

$$H1 = 3 \times F \times d1^2 \times (1 - v1)/(h^2 \times Y) \quad (3)$$
$$= 3 \times F \times d^2 \times (1 - v)/(h^2 \times Y) = H$$

$$d = \sqrt{\{(d1)^2 \times (1 - v1) \times Y/Y1 \times (1 - v)\}} \quad (4)$$

Therefore, by the shape of the vibration region P having a shape that satisfies the relationship of Equation (4), the shape of the vibration region P can have a shape according to a Young's modulus and a Poisson's ratio, which vary according to a crystal orientation. Accordingly, a strain that occurs in the vibration region P of the diaphragm 36 can be uniformized in the peripheral direction. In addition, by also making the shape of the piezoelectric element 37 similar to the shape of the vibration region P as illustrated in the plan view of FIG. 4, the piezoelectric element 37 can also be made as a shape according to a Young's modulus and a Poisson's ratio of the diaphragm 36, which vary according to a crystal orientation. Accordingly, strains of the piezoelectric elements 37 in the in-plane direction can also be uniformized in the peripheral direction of the vibration region P.

According to this configuration, since the entire diaphragm 36 is likely to be displaced and the occurrence of locally uneven stress concentration can be suppressed, the displacement properties of the diaphragm 36 can be improved while the generation of a crack is suppressed. In a case where the diaphragm 36 of the embodiment is manufactured, the diaphragm is manufactured by aligning a direction of the diaphragm 36 with a crystal orientation of a silicon base (silicon wafer) and cutting the diaphragm 36 out. In the embodiment, a silicon wafer formed of a single crystal silicon base of which the crystal plane is the (110) plane is used to form the diaphragm 36, for example, such that the direction of the axis Gx of the vibration region P is aligned with the crystal orientation [010] in the crystal plane. The diaphragm is cut out from the silicon wafer.

Figure 8:
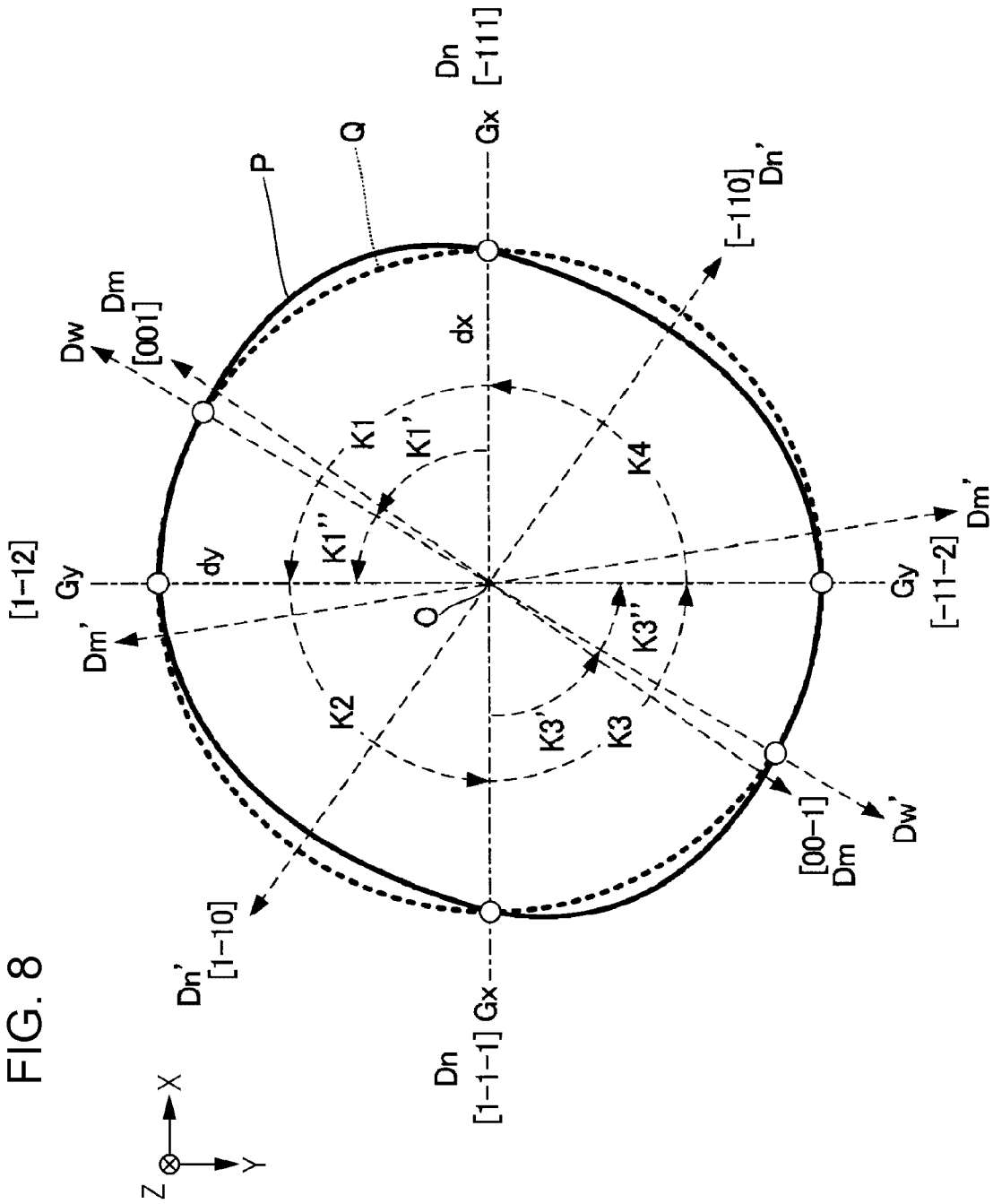
FIG. 8 is a view of an enlarged shape of a vibration region of FIG. 4.

FIG. 8 is a view of the enlarged shape of the vibration region P of FIG. 4. FIG. 8 is a view in which the inner periphery 345 of the pressure chamber C is formed such that the shape of the vibration region P is a shape that satisfies the relationship of Equation (4) in a case where the outer surface of the diaphragm 36 is configured of the crystal plane (110) of the single crystal silicon base. Since a shape that satisfies the relationship of Equation (4) is a perfect circle in a case where the outer surface of the diaphragm 36 is configured of the crystal plane (100) of the single crystal silicon base, a shape that satisfies the relationship of Equation (4) is a substantially circle in a case where the outer surface of the diaphragm 36 is configured of the crystal plane (110) of the single crystal silicon base, although not particularly illustrated. More detailed description will be given as follows.

Since the shape of the vibration region P of FIG. 8 is a substantially circle, characteristics of the shape of the vibration region P will be described by making the shape of the vibration region overlap an imaginary perfect circle Q and comparing with the perfect circle. As illustrated in FIG. 8, the axis Gx of the vibration region P runs along crystal orientations [-111] and [1-1-1], and the axis Gy runs along crystal orientations [1-12] and [-11-2]. The imaginary perfect circle Q has a diameter (diameter along the axis Gx) dx in the direction of the crystal orientation [-111] and a diameter (diameter along the axis Gy) dy in the direction of the crystal orientation [1-12], out of the diameters d of the vibration region P, in common. The center O of the imaginary perfect circle Q matches the center O of the vibration region P.

In FIG. 8, the vibration region P of the diaphragm 36 is divided into a first region K1 from the crystal orientation [-111] to the crystal orientation [1-12], a second region K2 from the crystal orientation [1-12] to the crystal orientation [1-1-1], a third region K3 from the crystal orientation [1-1-1] to the crystal orientation [-11-2], and a fourth region K4 from the crystal orientation [-11-2] to the crystal orientation [-111] in the crystal plane in the peripheral direction. At this time, when the shape of the vibration region P is compared with the imaginary perfect circle Q, the vibration region is on the inside of the imaginary perfect circle Q in the second region K2 and the fourth region K4, and at least some parts of the vibration region are on the outside of the imaginary perfect circle Q in the first region K1 and the third region K3. Therefore, the diameter d of the vibration region P in the second region K2 and the fourth region K4 is smaller than the diameter of the imaginary perfect circle Q.

When the first region K1 is divided into a region K1' from the crystal orientation [-111] to an orientation Dw of 59 degrees toward crystal orientation [1-12] and a region K1" from the orientation Dw to the crystal orientation [1-12], the vibration region P is on the outside of the imaginary perfect circle Q in the region K1'. Similarly, when the third region K3 is divided into a region K3' from the crystal orientation [1-1-1] to an orientation Dw' of 59 degrees toward crystal orientation [-11-2] and a region K3" from the orientation Dw' to the crystal orientation [-11-2], the vibration region P is on the outside of the imaginary perfect circle Q in the region K3'. Therefore, the diameter d of the vibration region P in the region K1' and the region K3' is larger than the diameter of the imaginary perfect circle Q.

On the other hand, in FIG. 7, when a change in the Young's modulus and the Poisson's ratio from the first region K1 to the fourth region K4 in the crystal plane (110) is considered, a change in the Poisson's ratio in the first region K1 and the third region K3 is not as great as a change in the second region K2 and the fourth region K4 but the Young's modulus changes more significantly from a maximum value (orientation Dn) to a minimum value (orientation Dm) in the first region and the third region than in the second region K2 and the fourth region K4. In particular, regions where a change in the Young's modulus is great are the region K1' and the region K3' each of which includes the maximum value (orientation Dn) and the minimum value (orientation Dm). On the contrary, a change in the Young's modulus as well as a change in the Poisson's ratio in the region K1" and the region K3" are small compared to other regions.

Since a deflection amount of the diaphragm 36 is likely to be suppressed in regions where a change in the Young's modulus is greater than a change in the Poisson's ratio, such as the region K1' of the first region K1 and the region K3' of the third region K3, the diaphragm can be made likely to deflect by making the diameter d of the vibration region P larger than the diameter of the perfect circle Q. On the contrary, by making the diameter d of the vibration region P almost the same as the diameter of the perfect circle Q in regions where a change in both of the Young's modulus and the Poisson's ratio is small, such as the region K1" of the first region K1 and the region K3" of the third region K3, a change in the peripheral direction can be made smaller.

On the contrary, in FIG. 7, a change in the Young's modulus in the second region K2 and the fourth region K4 is not as great as a change in the first region K1 and the third region K3 but the Poisson's ratio changes more significantly from a maximum value (orientation Dn') to a minimum value (orientation Dm') in the second region and the fourth region than in the first region K1 and the third region K3. Since a contracted amount of the diaphragm 36 in the in-plane direction greatly changes according to a peripheral direction in regions where a change in the Poisson's ratio is greater than a change in the Young's modulus, such as the second region K2 and the fourth region K4, an effect of a change in the contracted amount of the diaphragm 36 in-plane direction according to a peripheral direction on the deflection of the diaphragm 36 can be eased by making the diameter d of the vibration region P smaller than the diameter of the perfect circle Q.

According to the embodiment, the shape of the vibration region P of the diaphragm 36 can be made as a shape according to a change in the Young's modulus and the Poisson's ratio in the peripheral direction. For this reason, a strain that occurs in the vibration region P of the diaphragm 36 can be uniformized in the peripheral direction. Since the entire diaphragm 36 is likely to be displaced and the occurrence of locally uneven stress concentration can be suppressed, the displacement properties of the diaphragm 36 can be improved while the generation of a crack is suppressed.

The shape of the vibration region P illustrated in FIG. 8 is point-symmetric with respect to the center O of the vibration region P in the first region K1 and the third region K3, and is point-symmetric with respect to the center O of the vibration region P also in the second region K2 and the fourth region K4. On the other hand, a change in the Young's modulus and the Poisson's ratio in the peripheral direction of a crystal plane {110} illustrated in FIG. 7 is point-symmetric with respect to the center O in the first region K1 and the third region K3, and is point-symmetric with respect to the center also in the second region K2 and the fourth region K4. Therefore, a shape in accordance with the symmetry of the Young's modulus and the Poisson's ratio in the crystal plane {110} can be adopted by making the shape of the vibration region P as the shape of FIG. 8. Accordingly, an effect of uniformizing a strain that occurs in the vibration region P of the diaphragm 36 in the peripheral direction can be enhanced.

A case where the shape of the vibration region P is a shape that satisfies the relationship of Equation (4) is given as an example in FIG. 8. Without being limited thereto, however, the shape of the vibration region P may be a shape close to a shape that satisfies Equation (4). For example, the shape of the vibration region P may be a shape having characteristics in which the vibration region is on the inside of the imaginary perfect circle Q in the second region K2 and the fourth region K4 and at least some parts of the vibration region are on the outside of the imaginary perfect circle Q in the first region K1 and the third region K3. A case where the vibration region is point-symmetric with respect to the center O of the vibration region P in the first region K1 and the third region K3, and is point-symmetric with respect to the center O of the vibration region P also in the second region K2 and the fourth region K4 is given as an example in FIG. 8. Without being limited thereto, however, the vibration region may not necessarily be point-symmetric.

Although the vibration region P of FIG. 8 is given as an example of a case where the crystal plane (110) of the single crystal silicon base illustrated in FIG. 7 is the outer surface (top surface) of the diaphragm 36, the configuration of the embodiment is applicable also to a case where a (011) plane or a (101) plane, which is a crystal plane equivalent to the crystal plane (110), is the outer surface (top surface) of the diaphragm 36 since single crystal silicon has a cubic crystal system. Even when the crystal plane is the (011) plane or the (101) plane, the Young's modulus and the Poisson's ratio are in shapes shown in FIG. 7. However, in a case where the crystal plane is the (011) plane, crystal orientations [1-11], [1-12], [100], [21-1], [11-1], [01-1], and [-11-1] are applied by replacing the seven reference crystal orientations [-111], [-112], [001], [1-12], [1-11], [1-10], and [1-1-1] in FIG. 7, respectively. In addition, in a case where the crystal plane is the (101) plane, crystal orientations [11-1], [12-1], [010], [-121], [-1-11], [-101], and [-1-11] are applied by replacing the seven reference crystal orientations [-111], [-112], [001], [1-12], [1-11], [1-10], and [1-1-1] in FIG. 7, respectively. As described above, all of the crystal planes (100), (010), and (001) are equivalent to each other, and a plane group of the crystal planes can be altogether referred to as a crystal plane {100}.

In addition, since all of crystal orientations [-111], [1-11], and [11-1] are equal to each other, a direction group of the crystal orientation [-111] and equivalents thereof can be altogether referred to as a crystal orientation <-111>. Similarly, a direction group of the crystal orientation [1-12] and equivalents thereof can be altogether referred to as <1-12>, a direction group of the crystal orientation [1-1-1] and equivalents thereof can be altogether referred to as <1-1-1>, and a direction group of the crystal orientation [-11-2] and equivalents thereof can be altogether referred to as <-11-2>.

In the single crystal silicon base of which the crystal plane is the (100) plane illustrated in FIG. 6, the crystal plane may be the outer surface (top surface) of the diaphragm 36. The configuration of the embodiment is applicable also to a case where a (010) plane or a (001) plane, which is a crystal plane equivalent to the crystal plane (100), is the outer surface (top surface) of the diaphragm 36 since single crystal silicon has a cubic crystal system. Even when the crystal plane is the (010) plane or the (001) plane, the Young's modulus and the Poisson's ratio are in shapes shown in FIG. 6. However, in a case where the crystal plane is the (010) plane, crystal orientations [-100], [-101], and [001] are applied by replacing the three reference crystal orientations [010], [011], and [001] in FIG. 6, respectively. In a case where the crystal plane is the (001) plane, crystal orientations [010], [-110], and [-100] are applied by replacing the crystal orientations [010], [011], and [001] in FIG. 6, respectively. As described above, all of the crystal planes (100), (010), and (001) are equivalent to each other, and a plane group of the crystal planes can be altogether referred to as a crystal plane {100}.

Second Embodiment

Figure 9:
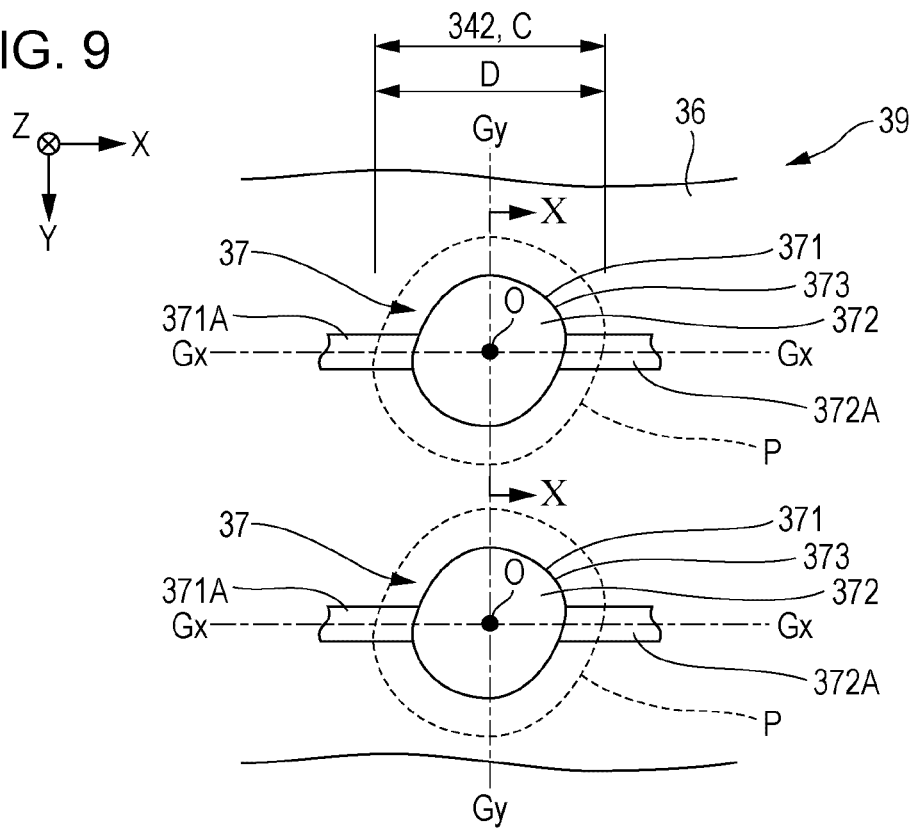
FIG. 9 is a plan view of a piezoelectric device of a second embodiment.
Figure 10:
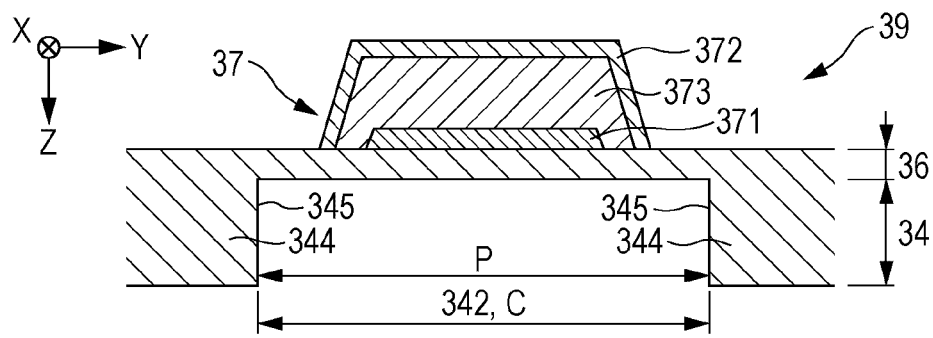
FIG. 10 is a sectional view of the piezoelectric device illustrated in FIG. 9 taken along line X-X.

A second embodiment of the invention will be described. In each form to be given as an example below, elements, of which operation and functions are the same as in the first embodiment, will be assigned with the same reference signs used in describing the first embodiment and detailed description of each of the elements will be omitted as appropriate. A specific configuration example of the piezoelectric elements 37 of the piezoelectric device 39 according to the first embodiment will be described in the second embodiment. FIGS. 9 and 10 are specific configuration examples of the piezoelectric element 37 of FIG. 4. FIG. 9 is a plan view of a case where the piezoelectric device 39 according to the second embodiment is seen from the Z-direction. FIG. 10 is a sectional view of the piezoelectric device 39 illustrated in FIG. 9 taken along line X-X.

As illustrated in FIGS. 9 and 10, the piezoelectric elements 37 of the second embodiment are disposed on the diaphragm 36 so as to overlap the centers O of the vibration regions P in plan view. Each of the piezoelectric elements 37 of FIG. 9 is a stacked body of which a piezoelectric layer 373 is sandwiched between a first electrode 371 and a second electrode 372, which face each other. By applying a voltage to an area between the first electrode 371 and the second electrode 372, a piezoelectric strain occurs in the piezoelectric layer 373 sandwiched between the first electrode 371 and the second electrode 372 and the piezoelectric element 37 of FIG. 9 is displaced. Therefore, in the configuration of FIG. 9, a portion where the first electrode 371, the second electrode 372, and the piezoelectric layer 373 overlap each other in plan view corresponds to each of the piezoelectric elements 37.

The first electrode 371 is separately formed on the outer surface of the diaphragm 36 for each of the piezoelectric elements 37 (for each of the nozzles N). Each of the first electrodes 371 is an electrode that extends in the Y-direction. Each of the first electrodes 371 is connected to the drive IC 62 via each of lead electrodes 371A pulled out to the outside of each of the piezoelectric layers 373. The lead electrodes 371A are electrically connected to each other, and each first electrode 371 is a common electrode for the plurality of piezoelectric elements 37.

Each of the first electrodes 371 is connected to the drive IC 62 via each of lead electrodes 371A pulled out to the outside of each of the piezoelectric layers 373. Each of the first electrodes 371 is a common electrode for the plurality of piezoelectric elements 37. A material that does not oxidize when forming the piezoelectric layers 373 and can maintain conductivity is preferable as a material of the first electrodes 371. For example, precious metals such as platinum (Pt) and iridium (Ir), or conductive oxides represented by lanthanum nickel oxides (LNO) are suitably used.

On an outer surface (outer surface on a side opposite to the diaphragm 36) of each of the first electrodes 371, the piezoelectric layer 373 and the second electrode 372 are separately formed for each of the piezoelectric elements 37 (for each of the nozzles N). As illustrated in FIG. 10, each of the second electrodes 372 is stacked on the first electrode 371 on the side opposite to the diaphragm 36, and each of the piezoelectric layers 373 is stacked so as to be sandwiched between the first electrode 371 and the second electrode 372. Each of the second electrodes 372 is an electrode that extends in the Y-direction. Each of the second electrodes 372 is separately connected to the drive IC 62 via each of lead electrodes 372A pulled out to the outside of each of the piezoelectric layers 373.

The piezoelectric layers 373 are made of, for example, a ferroelectric ceramic material showing electromechanical conversion action, such as a crystal film (perovskite type crystal) having a perovskite structure. The material of the piezoelectric layers 373 is not limited to the material described above. For example, in addition to a ferroelectric piezoelectric material, such as lead zirconate titanate (PZT), and a ferroelectric piezoelectric material to which a metal oxide, such as a niobium oxide, a nickel oxide, and a magnesium oxide, is added, non-lead-based piezoelectric materials that do not include lead can be used without being limited to lead-based piezoelectric materials that include lead.

The piezoelectric layer 373 is formed by being patterned for each of the pressure chambers C. Each of the second electrodes 372 is provided on a surface of each of the piezoelectric layers 373 on a side opposite to each of the first electrodes 371, and configures a separate electrode corresponding to each of the plurality of piezoelectric elements 37. Each of the second electrodes 372 may be directly provided on each of the piezoelectric layers 373, or other members may be sandwiched between the piezoelectric layers 373 and the second electrodes 372.

A material that can form an interface between the piezoelectric layer 373 and the material well and can demonstrate insulation properties and piezoelectric properties is desirable for the second electrodes 372. For example, a precious metal material, such as iridium (Ir), platinum (Pt), palladium (Pd), and gold (Au), or conductive oxides represented by lanthanum nickel oxides (LNO) is suitably used. The second electrodes 372 may be formed by stacking a plurality of materials.

A case where in the piezoelectric elements 37 of the embodiment, the first electrodes 371 are set as common electrodes for the plurality of piezoelectric elements 37 and the second electrodes 372 are set as separate electrodes corresponding to the plurality of piezoelectric elements 37 is given as an example. Without being limited to the configuration, however, the second electrodes 372 may be set as common electrodes for the plurality of piezoelectric elements 37 and the first electrodes 371 may be set as separate electrodes corresponding to the plurality of piezoelectric elements 37. Although a case where the diaphragm 36 is configured of a single layer is given as an example in the embodiment described above, the diaphragm may be configured of a plurality of layers without being limited thereto.

A case where the pressure chamber substrate 34 and the diaphragm 36 are configured of separate bodies is given as an example in the first embodiment. Without being limited thereto, the pressure chamber substrate 34 and the diaphragm 36 may be integrated with each other so as to form the pressure chambers C and the diaphragm 36 at once as in the embodiment. In the configuration, by selectively removing, in accordance with a crystal orientation, a part of a region corresponding to each of the pressure chambers C in a thickness direction from a single crystal silicon base having a predetermined thickness, the pressure chambers C and the diaphragm 36 can be formed at once.

In such a second embodiment, the outer surface of the diaphragm 36 is configured of the crystal plane (110) of the single crystal silicon base as in the first embodiment. The shape of the vibration region P is the same as the shape illustrated in FIG. 8, and the shape of the piezoelectric element 37 is similar to the shape of the vibration region P. Therefore, also in the piezoelectric device 39 of the second embodiment, the displacement properties of the diaphragm 36 can be improved while the generation of a crack in the diaphragm 36 or the piezoelectric elements 37 is suppressed as in the first embodiment.

Figure 11:
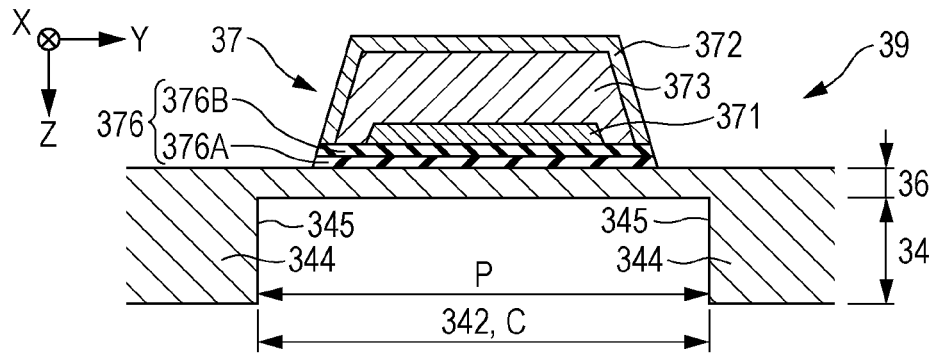
FIG. 11 is a plan view of a piezoelectric device according to a modification example of the second embodiment.

In a configuration of a modification example of the second embodiment illustrated in FIG. 11, an adhesive layer 376 for ensuring adhesion is provided between the piezoelectric element 37 and the diaphragm 36. The adhesive layer 376 of FIG. 11 is formed of a silicon oxide film 376A and a zirconia oxide film 376B. The silicon oxide film 376A and the zirconia oxide film 376B are stacked in this order on the diaphragm 36. Since the adhesive layer 376 has toughness higher than single crystal silicon that configures the diaphragm 36, the adhesive layer is made as thin as possible and is made so as not to be formed in a portion close to the inner periphery 345 of the side wall 344 as illustrated in FIG. 11. By adopting the configuration described above, the displacement properties of the diaphragm 36 can be improved since the portion close to the inner periphery 345 of the side wall 344 of the pressure chamber C is likely to deform compared to a case where the adhesive layer 376 is formed over the entire vibration region P.

Modification Example

The forms and the embodiments given as examples above can be variously changed. Examples of forms of specific deformation are given as follows. Any two or more forms selected from the following examples and the forms described above can be combined as appropriate unless the selected forms are inconsistent with each other.

(1) Although a serial head that repeatedly causes the carriage 242, on which the liquid discharging heads 26 are mounted, to reciprocate in the X-direction is given as an example in the embodiments described above, the invention is also applicable to a line head in which the liquid discharging heads 26 are arranged over the entire width of the medium 12.

(2) Although the piezoelectric liquid discharging heads 26, in which the piezoelectric elements mechanically vibrating the pressure chambers are used, are given as an example in the embodiments described above, it is also possible to adopt thermal liquid discharging heads in which heating elements generating bubbles inside the pressure chambers by heating are used.

(3) The liquid discharging apparatus 10 given as an example in the embodiments described above can be adopted in various types of devices such as a facsimile device and a copier, in addition to a device exclusive to printing. The use of the liquid discharging apparatus 10 of the invention is not limited to printing. For example, a liquid discharging apparatus that discharges a color material solution is used as a manufacturing apparatus that forms a color filter of a liquid crystal display device, an organic electroluminescent (EL) display, and a field emission display (FED). A liquid discharging apparatus that discharges a conductive material solution is used as a manufacturing apparatus that forms wiring of a wiring substrate and an electrode. In addition, the liquid discharging apparatus is also used as a chip manufacturing apparatus that discharges a bioorganic solution as a type of a liquid.

What is claimed is:

1. A piezoelectric device comprising:
a pressure chamber;
a piezoelectric element; and
a diaphragm disposed between the pressure chamber and the piezoelectric element,
wherein the diaphragm has a crystal plane {110} of a single crystal silicon base,
the diaphragm has a vibration region that overlaps the pressure chamber in plan view,
the piezoelectric element overlaps the vibration region in plan view, and
when the vibration region is divided into (1) a first region between a crystal orientation axis <-111> and a crystal orientation axis <1-12>, (2) a second region between the crystal orientation axis <1-12> and a crystal orientation axis <1-1-1->, (3) a third region between the crystal orientation axis <1-1-1> and a crystal orientation axis <-11-2>, and (4) a fourth region between the crystal orientation axis <-11-2> to the crystal orientation axis <-111> in the crystal plane in a peripheral direction,
each of the crystal orientation axis <-111>, the crystal orientation axis <1-12>, the crystal orientation axis <1-1-1>, and the crystal orientation axis <-11-2> starts from a center of the crystal plane {110} and projects out in the peripheral direction,
an imaginary perfect circle has a center that overlaps the center of the crystal plane,
the vibration region is on an inside of the imaginary perfect circle in the second region and the fourth region, and at least some parts of the vibration region are on an outside of the imaginary perfect circle in the first region and the third region if a shape of the vibration region is compared with the imaginary perfect circle which has a diameter in a direction of the crystal orientation axis <-111> and a diameter in a direction of the crystal orientation axis <1-12> in common with the vibration region.

2. The piezoelectric device according to claim 1,
wherein the vibration region is on the outside of the imaginary perfect circle in a region of the first region, which ranges from the crystal orientation axis <-111>to an orientation of 59 degrees toward the crystal orientation axis <1-12>, and
the vibration region is on the outside of the imaginary perfect circle in a region of the third region, which ranges from the crystal orientation axis <1-1-1>to an orientation of 59 degrees toward the crystal orientation axis <-11-2>.

3. The piezoelectric device according to claim 1,
wherein the shape of the vibration region is point-symmetric with respect to a center of the vibration region in the first region and the third region, and is point-symmetric with respect to the center of the vibration region in the second region and the fourth region.

4. A liquid discharging head comprising:
the piezoelectric device according to claim 1,
wherein a liquid that has filled the pressure chamber is discharged from a nozzle by the piezoelectric element vibrating the diaphragm to change a pressure of the pressure chamber.

5. A liquid discharging head comprising:
the piezoelectric device according to claim 2,
wherein a liquid that has filled the pressure chamber is discharged from a nozzle by the piezoelectric element vibrating the diaphragm to change a pressure of the pressure chamber.

6. A liquid discharging head comprising:
the piezoelectric device according to claim 3,
wherein a liquid that has filled the pressure chamber is discharged from a nozzle by the piezoelectric element vibrating the diaphragm to change a pressure of the pressure chamber.

7. A liquid discharging apparatus comprising:
the piezoelectric device according to claim 1,
wherein a liquid that has filled the pressure chamber is discharged from a nozzle by the piezoelectric element vibrating the diaphragm to change a pressure of the pressure chamber.

8. A liquid discharging apparatus comprising:

the piezoelectric device according to claim 2,
wherein a liquid that has filled the pressure chamber is discharged from a nozzle by the piezoelectric element vibrating the diaphragm to change a pressure of the pressure chamber.

9. A liquid discharging apparatus comprising:
the piezoelectric device according to claim 3,
wherein a liquid that has filled the pressure chamber is discharged from a nozzle by the piezoelectric element vibrating the diaphragm to change a pressure of the pressure chamber.

\* \* \* \* \*